US012657364B2

(12) United States Patent
Sarar et al.

(10) Patent No.: US 12,657,364 B2
(45) Date of Patent: Jun. 16, 2026

(54) MACHINE-LEARNING-BASED INTEGRATED CIRCUIT TEST CASE SELECTION

(71) Applicant: QUALCOMM Incorporated, San Diego, CA (US)

(72) Inventors: Gokce Sarar, San Diego, CA (US); Guillaume Shippee, La Jolla, CA (US); Rhys Buggy, Enniskerry (IE); Santanu Pattanayak, Bangalore (IN); Tushit Jain, Bangalore (IN); Suman Kumar Gunnala, San Diego, CA (US); Kumar Raj, San Diego, CA (US); Vatsal Nimeshkumar Thakkar, Longmont, CO (US)

(73) Assignee: QUALCOMM Incorporated, San Diego, CA (US)

( * ) Notice: Subject to any disclaimer, the term of this patent is extended or adjusted under 35 U.S.C. 154(b) by 685 days.

(21) Appl. No.: 18/187,198

(22) Filed: Mar. 21, 2023

(65) Prior Publication Data

US 2024/0320408 A1 Sep. 26, 2024

(51) Int. Cl.
*G06F 30/30* (2020.01)
*G06F 30/333* (2020.01)
*G06N 3/084* (2023.01)

(52) U.S. Cl.
CPC ........... *G06F 30/333* (2020.01); *G06N 3/084* (2013.01)

(58) Field of Classification Search
CPC ....... G06F 30/333; G06F 30/30; G06N 3/084; G01R 31/31835
See application file for complete search history.

(56) References Cited

U.S. PATENT DOCUMENTS

| | | | | |
|---|---|---|---|---|
| 11,928,411 | B2 * | 3/2024 | Kostas | ................... G06F 30/27 |
| 12,333,227 | B1 * | 6/2025 | Zorian | ................... G06F 30/27 |
| 2005/0096866 | A1 * | 5/2005 | Shan | ................... G06F 11/0751 |
| | | | | 702/179 |
| 2020/0364134 | A1 * | 11/2020 | Gal | ................ G01R 31/31835 |
| 2021/0124676 | A1 | 4/2021 | Ackerman et al. | |
| 2022/0129613 | A1 | 4/2022 | Jindal et al. | |

OTHER PUBLICATIONS

International Search Report and Written Opinion—PCT/US2024/012213—ISA/EPO—May 22, 2024.

* cited by examiner

*Primary Examiner* — Nghia M Doan
(74) *Attorney, Agent, or Firm* — Patterson & Sheridan LLP

(57) ABSTRACT

Certain aspects of the present disclosure provide techniques and apparatus for testing integrated circuit designs. An example method generally includes generating a coverage matrix associated with a plurality of test cases for an integrated circuit and coverage points associated with each test case of the plurality of test cases. A subset of the plurality of test cases is selected for execution based on weights associated with each test case of the plurality of test cases and a threshold weight value. Generally, the weights associated with each test case comprise weights in a machine learning model trained based on the coverage matrix. The integrated circuit may be tested based on the selected subset of test cases.

27 Claims, 5 Drawing Sheets

100

Test Case Selector 130

Optimized Test Case List

Coverage Probabilities Per Test

Testing System 120

Test Cases 110

200

210

| | Test 1 | Test 2 | Test 3 | • • • | Test 1000 |
|---|---|---|---|---|---|
| Cover bin 1 | $P(c1 = 1|t1) = 0.8$ | 0.5 | 0 | | 0 |
| Cover bin 2 | | | | | |
| • • • | $P(c_i = 1|t_j) =$ Probability Bin i is hit with Test j | | | | |
| Cover bin 1M | | | | | |

×

220

| Seed Count Per Test in Regression $w_i$ | |
|---|---|
| Test1 | W1 = 1 |
| Test2 | W2 = 1 |
| • • • | |
| Test 1000 | W1000 = 0 |

=

230

| Expected Coverage per Bin in Regression | |
|---|---|
| Bin1 | Y1 = 1.3 |
| Bin2 | Y2 |
| | • • • |
| Bin 1M | Y1M |

*FIG. 2*

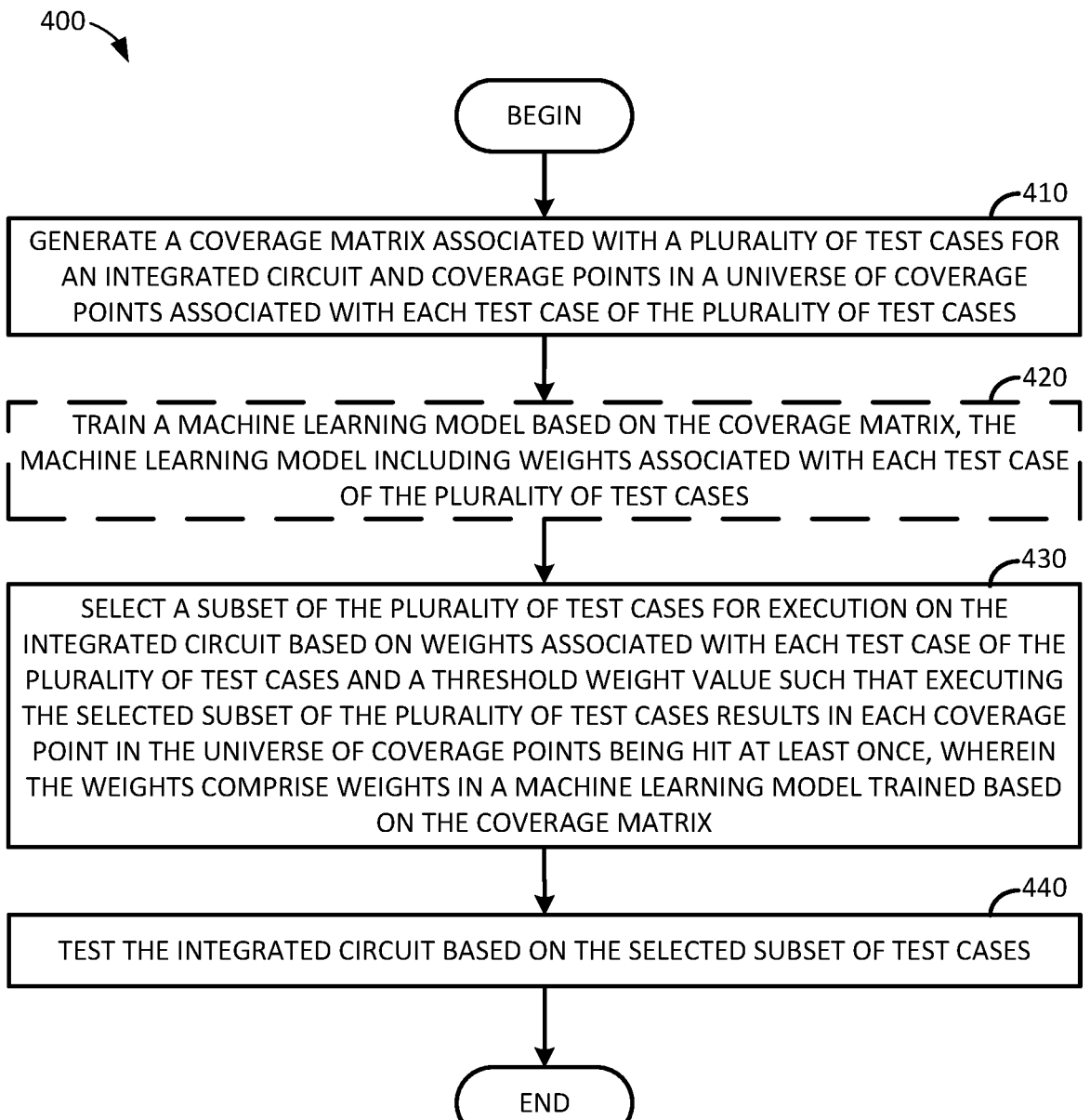

400

BEGIN

410

GENERATE A COVERAGE MATRIX ASSOCIATED WITH A PLURALITY OF TEST CASES FOR AN INTEGRATED CIRCUIT AND COVERAGE POINTS IN A UNIVERSE OF COVERAGE POINTS ASSOCIATED WITH EACH TEST CASE OF THE PLURALITY OF TEST CASES

420

TRAIN A MACHINE LEARNING MODEL BASED ON THE COVERAGE MATRIX, THE MACHINE LEARNING MODEL INCLUDING WEIGHTS ASSOCIATED WITH EACH TEST CASE OF THE PLURALITY OF TEST CASES

430

SELECT A SUBSET OF THE PLURALITY OF TEST CASES FOR EXECUTION ON THE INTEGRATED CIRCUIT BASED ON WEIGHTS ASSOCIATED WITH EACH TEST CASE OF THE PLURALITY OF TEST CASES AND A THRESHOLD WEIGHT VALUE SUCH THAT EXECUTING THE SELECTED SUBSET OF THE PLURALITY OF TEST CASES RESULTS IN EACH COVERAGE POINT IN THE UNIVERSE OF COVERAGE POINTS BEING HIT AT LEAST ONCE, WHEREIN THE WEIGHTS COMPRISE WEIGHTS IN A MACHINE LEARNING MODEL TRAINED BASED ON THE COVERAGE MATRIX

440

TEST THE INTEGRATED CIRCUIT BASED ON THE SELECTED SUBSET OF TEST CASES

END

502 CPU

512 WIRELESS CONNECTIVITY

504 GPU

508 NPU

506 DSP

522 INPUT/OUTPUT

524 MEMORY

524A COVERAGE MATRIX GENERATING COMPONENT

524C TEST CASE SELECTING COMPONENT

524B MODEL TRAINING COMPONENT

524D INTEGRATED CIRCUIT TESTING COMPONENT

MACHINE-LEARNING-BASED INTEGRATED CIRCUIT TEST CASE SELECTION

INTRODUCTION

Aspects of the present disclosure relate to integrated circuit testing.

Integrated circuits (ICs) are electronic circuits that may be designed and fabricated to form a complete processing unit, such as a central processing unit (CPU), graphics processing unit (GPU), neural processing unit (NPU), digital signal processor (DSP), application-specific integrated circuit (ASIC), system-on-a-chip (SoC), or the like. To design an integrated circuit, various software modules can be used to design various components of the integrated circuit. For example, a component of an integrated circuit may be defined as a soft macro that specifies the functionality of the component irrespective of a process by which the integrated circuit will be fabricated, or as a hard macro in which the functionality of the component is tied to a specific fabrication process.

During the design process, various tests may be performed on an integrated circuit design before the integrated circuit design is finalized and made available to a semiconductor foundry for manufacturing (also known as being "taped out"). These tests may be designed to cover various logic paths within an integrated circuit to verify that the integrated circuit, as designed, generates a correct result along some given logic path and does so according to various timing constraints defined for the integrated circuit. These tests may also cover the performance of an integrated circuit for different variations in fabrication and/or operating parameters (also known as process-voltage-temperature (PVT) test cases). Because there are a large number of tests that can be run to verify the performance of an integrated circuit design, testing integrated circuits using electronic design automation (EDA) tools may be a resource-intensive process. Further, some tests may test multiple coverpoints (also referred to as "coverage points"), and the selection and execution of these tests may result in the duplication of work, which thus may use resources that could be used to perform other tests that cover non-redundant coverage points on the integrated circuit (or at least could minimize an amount of redundancy involved in testing an integrated circuit).

Accordingly, what is needed are techniques for efficiently selecting test cases to use in testing integrated circuit designs.

BRIEF SUMMARY

Certain aspects provide a method for testing integrated circuit designs. The method generally includes generating a coverage matrix associated with a plurality of test cases for an integrated circuit and coverage points in a universe of coverage points associated with each test case of the plurality of test cases. A subset of the plurality of test cases is selected for execution on the integrated circuit based on weights associated with each test case of the plurality of test cases and a threshold weight value, wherein the weights associated with each test case of the plurality of test cases comprise weights in a machine learning model trained based on the coverage matrix. The integrated circuit is tested based on the selected subset of test cases.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer-readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

The appended figures depict certain features of one or more aspects of the present disclosure and are therefore not to be considered limiting of the scope of this disclosure.

FIG. 2 illustrates a coverage matrix and weights used to achieve a testing objective of hitting each coverage bin in an integrated circuit at least once.

FIG. 4 illustrates example operations that may be performed by an integrated circuit testing system to test an integrated circuit design based on a set of test cases identified by a machine learning model, according to aspects of the present disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1:
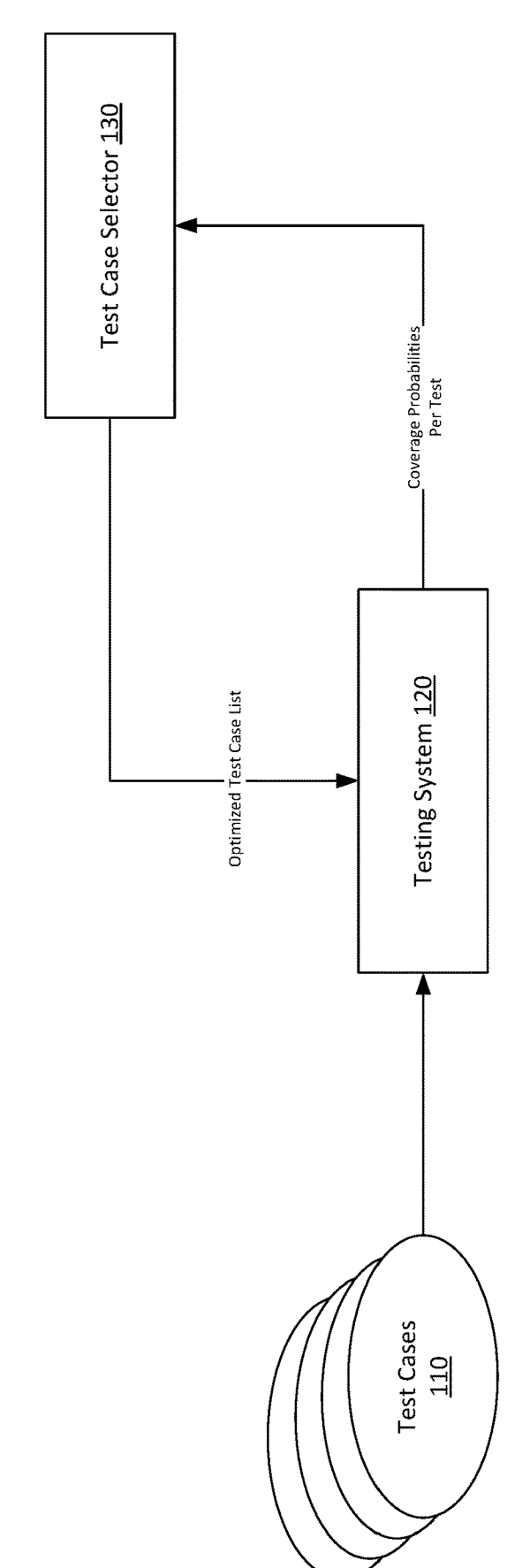
FIG. 1 illustrates an example pipeline for testing integrated circuit designs.

Aspects of the present disclosure provide apparatuses, methods, processing systems, and computer-readable mediums for testing integrated circuit designs based on test cases identified using machine learning techniques.

During the development process, integrated circuits may be defined in terms of individual circuits, sub-systems, and/or the full system-on-a-chip (SoC). Various test cases may be executed on simulations of these individual circuits, sub-systems, and the SoC itself (e.g., virtual circuits laid out in a design file or other construct illustrating electrical relationships (which may include spatial characteristics such as trace length maximums or stub lengths) between different components in a circuit) to ensure that the SoC and its subsystems operate as expected. For example, the simulated SoC and its subsystems may be tested to ensure that timing constraints are met so that a signal does not arrive too early or too late relative to an expected time of arrival. For circuits that fail a timing test for a given test case, the design of the simulated circuit may be redesigned and re-tested. Additionally, after smaller components are verified, larger components incorporating these smaller components may be tested against the various test cases to ensure that these larger components also meet the timing constraints. If the larger components do not meet these timing constraints, then the larger component may be redesigned to rectify the performance issues.

Testing integrated circuit designs is generally a time-intensive process. As the number of test cases increases for a given integrated circuit design, the computing resources (processing time, memory, etc.) may similarly increase. Thus, for an integrated circuit design with a large number of test cases to be tested (e.g., corresponding to different portions of a circuit, functions to be executed on the integrated circuit, process parameters, operating voltages (corresponding to processor speed), operating temperatures, and the like), computational resources utilization for testing an integrated circuit on an individual component, sub-system, and SoC level may correspondingly increase.

As circuit designs become larger and more complicated, writing directed tests to test a universe of all possible coverage points within a circuit design may become impractical. To test integrated circuit designs, thus, automatically generated random tests can be used. However, because of the nature of automatically generated random tests, a significant number of test runs may be performed in order to achieve a desired level of test coverage (e.g., to test all possible coverage points for a given circuit design). The large number of test runs performed to test an integrated circuit design may reduce the amount of time available to address flaws or performance issues in a circuit design before the design is "taped out" (e.g., fixed for manufacturing).

Aspects of the present disclosure provide techniques and apparatus for testing integrated circuit designs using a set of test cases selected from a broader universe of test cases using machine learning techniques. The selected set of test cases may be a fractional subset of the universe of test cases and may be a set of test cases selected such that there is a high likelihood that each coverage point in a universe of coverage points defined for the design of the integrated circuit is tested at least once using the selected set of test cases. To generate the selected set of test cases, a machine learning model may be trained based on a coverage matrix to achieve the target of testing each coverage point in the universe of coverage points defined for the design of the integrated circuit at least once. Weights in the machine learning model may be associated with each test case. The set of test cases can be selected based on the weights in the machine learning model and a threshold weight value so that executing the set of test cases results in each coverage point for the integrated circuit being hit at least once during testing, but with a subset of the universe of test cases defined for the design of the integrated circuit. By testing an integrated circuit design using a set of test cases smaller than a broader universe of test cases defined for the integrated circuit, computing resources used in testing integrated circuit designs may be reduced relative to testing an integrated circuit design using the broader universe of test cases.

Example Integrated Circuit Design Testing Pipeline

FIG. 1 illustrates an example testing pipeline 100 in which integrated circuit designs are tested against a plurality of test cases 110. As illustrated, pipeline 100 includes a testing system 120 and a test case selector 130.

For a given integrated circuit design, the plurality of test cases 110 can be defined (e.g., generated or at least designed by a test engineer). These test cases 110 may include test cases to test the functionality of an integrated circuit against a defined specification, which may define the correctness of outputs, timing constraints within the integrated circuit, and other functional and/or performance characteristics of the integrated circuit. These test cases may also include functional test cases to determine whether an integrated circuit accurately performs a given operation, process-voltage-temperature (PVT) test cases for the integrated circuit design, and the like. Functional test cases may specify input values for an integrated circuit or a portion thereof (e.g., a logic unit, an arithmetic unit such as a floating point unit or an integer calculation unit) and a correct output for the specified input values. An integrated circuit may be deemed to have passed a functional test if the specified correct output is generated for the specified input values, and the integrated circuit may be deemed to have failed a functional test if an output different from the specified correct output is generated for the specified input values. In some aspects, the functional test cases may further include timing-related criteria, such as a target elapsed time for performing the test (plus or minus a threshold amount of time). If the integrated circuit (or portion thereof) performs the test on the correct side of the threshold amount of the target elapsed time, then the integrated circuit may be deemed to have passed the test; otherwise, the integrated circuit may have performed the test more slowly or more quickly than expected and may thus be deemed to have failed the test.

For PVT test cases, process parameters may include a plurality of front-end-of-line (FEOL) parameters and a plurality of back-end-of-line (BEOL) parameters. FEOL parameters may include information about conditions that impact the construction or fabrication of components within a silicon wafer on which an integrated circuit is fabricated. BEOL parameters may include information about conditions that may impact the metallization of interconnects between different components within an integrated circuit. In some cases, process parameters may be classified as slow, typical, or fast, where slow process parameters describe electron mobility characteristics that are slower than those associated with typical process parameters and fast process parameters describe electron mobility characteristics that are faster than those associated with typical process parameters. The operation region parameters defined in a PVT test case may include voltage and temperature parameters. The voltage parameters may be associated with different voltage regimes in which an integrated circuit is to operate. These voltage regimes may be defined for various performance levels and power utilization levels. For example, a baseline performance regime, associated with a baseline level of performance for an SoC or other integrated circuit, may be associated with a given nominal voltage. Various "turbo" modes may be defined based on voltages that exceed the nominal voltage. Various power-saving modes may likewise be defined based on voltages that fall below the nominal voltage. Temperature parameters in a PVT test case may be a range of operating temperatures in which an integrated circuit is to operate. In some cases, to test an integrated circuit design, the temperature parameters in a PVT case may be a minimum and/or maximum operating temperature.

Testing system 120 generally executes the test cases 110 to verify the performance and functionality of the integrated circuit design under test. In some aspects, testing system 120 can monitor and generate information such as the coverage points which are tested (or "hit") during execution of each test case in the universe of test cases 110 defined for the design of the integrated circuit and generate a coverage matrix illustrating the probability that a test case tests each coverage point of a universe of coverage points defined for the design of the integrated circuit for which the integrated circuit is tested. This coverage matrix may be generated based on historical testing information generated by testing system 120 during testing of an integrated circuit design and, in some aspects, other, similar, integrated circuit designs.

Generally, each row in a coverage matrix may correspond to a specific test case in the universe of test cases 110 defined for the design of the integrated circuit, and each column in the coverage matrix may correspond to a coverage point to be tested for the integrated circuit. Historical data generated by testing system 120 can be used to generate probability values for each combination of test case and coverage point. The probability value for each combination of a specific test case and a specific coverage point may be calculated based on the number of times the specific coverage point is tested (or hit) during execution of the specific test case and the number of times the specific test case is executed in the historical data generated by testing system 120.

Test case selector 130 uses the coverage matrix generated by testing system 120 or otherwise generated based on the coverage data generated by testing system 120 to train a machine learning model to generate a set of test cases which results in each coverage point within a universe of coverage points defined for the design of the integrated circuit being tested (or hit) at least once. The generated set of test cases may be selected to minimize, or at least reduce, redundancies or overlap between coverage points tested (or hit) by the test cases in the generated set of test cases. In some aspects, the generated set of test cases may be a minimal set of test cases, or the smallest number of test cases which results in each coverage point within a universe of coverage points defined for the design of the integrated circuit being tested (or hit) at least once. In some aspects, the generated set of test cases may be larger than a minimal set of test cases, but significantly smaller than the overall universe of test cases 110 defined for the design of the integrated circuit, which may at least reduce the amount of compute resources used in testing an integrated circuit design.

In some aspects, the machine learning model trained by test case selector 130 may be a neural network including a plurality of input nodes and a single output node. Each input node of the plurality of input nodes may represent an individual test case in the universe of test cases 110, and the output node of the neural network may represent expected coverage for the integrated circuit being tested. The neural network may, in some aspects, include a single layer mapping the plurality of input nodes to the output node. Each input node (which, as discussed, corresponds to a specific test case in the universe of test cases 110 defined for the design of the integrated circuit) may be associated with a weight value $w(t_i)$ in the machine learning model, where i corresponds to an index assigned to a test case in the universe of test cases 110 defined for the design of the integrated circuit. In some aspects, the weight value $w(t_i)$ may correspond to the number of times the $i^{th}$ test case should be executed to contribute to each coverage point in the universe of coverage points defined for the design of the integrated circuit being hit at least once.

Generally, the machine learning model may be trained to generate an expected coverage exceeding 1 for each coverage point in the universe of coverage points defined for the design of the integrated circuit which is to be tested (e.g., generate a set of test cases in which each coverage point is tested (or hit) at least once during execution of test cases in the generated set of test cases). The objective of the machine learning model may be to select a minimal set of test cases to use in testing an integrated circuit. This objective may be represented as a relaxed integer linear programming problem, according to the expression:

$$\min \sum_{i=0}^{N-1} w_i$$

subject to the constraint $Aw \geq 1$; $w_i \geq 0$, where A represents a coverage matrix (e.g., matrix 210 illustrated in FIG. 2 and described in further detail below) illustrating the probabilities of each coverage point being hit by executing a given test case, defined as a binomial distribution, and $w_i$ is the test seed count (e.g., a number of times a test is executed using test inputs with values generated from a random source created using different seed values) for the $i^{th}$ test case of the N test cases 110. In solving this relaxed integer linear programming problem, it may be observed that as the number of coverage points increases, the number of constraints around selecting the minimal set of test cases to use in testing an integrated circuit such that each coverage point is hit at least once increases. Further, for some coverage points with a hit probability of $P(c_i=1|t_j) \approx 0$—where j represents an index of a test case and $P(c_i=1|t_j)$ represents the probability that the $j^{th}$ test case tests the $i^{th}$ coverage point $c_i$ based on the historical data generated by testing system 120—the search space over which the optimal set of test cases is to be identified may be so large as to make finding the optimal set of test cases an infeasibly complex problem for a human.

To train the machine learning model to generate the expected coverage, aspects of the present disclosure may convert the integer linear programming problem discussed above to a stochastic optimization problem. This stochastic optimization problem may be solved by minimizing, or at least reducing, a hinge loss and weighted norm for a given batch size of test cases in the universe of test cases 110 defined for the design of the integrated circuit. The hinge loss may be represented by the expression:

$$\frac{1}{N'} \sum_{i=0}^{N'-1} \max\left(0, 1 - \sum_{j=0}^{M-1} w(t_j) P(c_i = 1 \mid t_j)\right)$$

where L is the loss function, N' represents a minibatch size, j represents an index of a test case in a universe of M test cases defined for the design of the integrated circuit, and $w(t_j)$ represents a weight assigned to the $j^{th}$ test case.

The weighted norm (also referred to as a distance value) that accounts for the computational expense of executing a given test case on an integrated circuit. As used herein, "executing a test case on an integrated circuit" generally refers to running a test case to test some aspect of the integrated circuit, which may involve, for example, operating the integrated circuit, testing a periphery of the integrated circuit, and/or executing instructions with the integrated circuit. Generally, computation expense, or the cost of executing a test, may be related to the amount of time elapsed during a test, with tests having longer runtimes being more computationally expensive than tests having shorter runtimes. Thus, test case selector 130 can generate a cost vector $\alpha = [\alpha_0, \alpha_1, \alpha_2, \ldots, \alpha_{M-1}]$, where $\alpha_j$, $j \in \{0, 1, 2, \ldots, M-1\}$ represents the computational expense of executing the $j^{th}$ test case. The loss function backpropagated through the machine learning model to generate a set of weights associated with the universe of test cases may thus be represented by the equation:

$$L = \frac{1}{N'} \sum_{i=0}^{N'-1} \max\left(0, 1 - \sum_{j=0}^{M-1} w(t_j)P(c_i = 1 \mid t_j)\right) + \lambda \sum_{j=0}^{M-1} \alpha_j * w_j^2$$

where $\lambda$ represents a regularization parameter which denotes a degree by which weights are modified within a layer of the machine learning model. The regularization parameter $\lambda$ may, in some aspects, be based on a number of tests for which records exist in testing system 120, a total elapsed time over which the tests for which records exist in testing system 120 were executed, or other parameters which may be used to regularize the weighted norm term:

$$\sum_{j=0}^{M-1} \alpha_j * w_j^2.$$

In some aspects, where cost is not a factor and the machine learning model is trained to minimize, or at least reduce, the number of test cases executed in order to test the integrated circuit, the value a for each of the M test cases may be set to 1. Otherwise, to generate a set of test cases which considers both the number of test cases executed and the computational expense of executing these test cases on an integrated circuit, the value $\alpha_j$ for each of the M test cases may be set to a value commensurate with the computational expense of the $j^{th}$ test case. In some aspects, the cost vector can be regularized based on the computation expense of the most expensive test case to execute on the integrated circuit. A regularized cost vector may thus include a value of 1 for the cost of the most expensive test case and values less than 1 for the cost of each of the other test cases, with the value a for each test case being scaled relative to the cost of the most expensive test case. For example, if a given test case has a runtime that is one-fourth that of the most expensive test case, then the value of a for the given test case in the cost vector may be 0.25.

Test case selector 130 can use the weights generated by training the machine learning model to generate an optimized, or at least reduced, set of test cases (e.g., set 220 illustrated in FIG. 2) to execute on the integrated circuit, where the optimized (or reduced) set of test cases is smaller than the overall universe of test cases 110 defined for the design of the integrated circuit. In some aspects, to generate the optimized (or reduced) set of test cases, test case selector 130 can compare a weight value associated with a test case against a threshold weight value. If the weight value associated with a test cases exceeds the threshold weight value, then the test case can be included in the optimized (or reduced) set of test cases. Otherwise, the test case may be omitted from the set of test cases. The threshold value may be defined a priori or based on one or more statistical measures generated based on the weights associated with the test cases in the universe of test cases 110 defined for the design of the integrated circuit. This optimized (or reduced) set of test cases may be output to testing system 120 for use in future testing of specific integrated circuit designs. As discussed, because the optimized (or reduced) set of test cases may be smaller than the universe of test cases 110 defined for the design of the integrated circuit, testing system 120 may test integrated circuit designs based on the optimized (or reduced) set of test cases using fewer compute resources (processor cycles, memory, network bandwidth, etc.) than testing system 120 would use in testing an integrated circuit design using the universe of test cases 110 defined for the design of the integrated circuit. Further, because the optimized (or reduced) set of test cases is designed, based on the weights and threshold weight for selecting test cases, to attempt to test each coverage point at least once while minimizing, or at least reducing, the amount of redundancy involved in executing test cases, aspects of the present disclosure may reduce the amount of compute resources wasted by performing multiple tests that hit the same coverage point.

Example Machine-Learning-Based Test Selection

FIG. 2 illustrates a coverage matrix 210 and weights used to achieve a testing objective of hitting each coverage bin in an integrated circuit at least once, according to aspects of the present disclosure.

As illustrated, coverage matrix 210 is a two-dimensional matrix in which each row represents a coverage bin and each column represents a test case from a universe of test cases (e.g., test cases 110 illustrated in FIG. 1). For each combination of test case and coverage bin, a probability that the test will hit (or test) a particular coverage point may be calculated based on historical test case execution data. That is, for the $j^{th}$ test t; and the $i^{th}$ coverage point $c_j$, the value in cell (i, j) of the coverage matrix 210 may be represented as $P(c_i=1 \mid t_j)$. As illustrated, for example, test 1 may have a probability of hitting coverage bin (or coverage point) 1 of 0.8, a probability of hitting coverage bin 2 of 0.5, a probability of hitting coverage bin 3 of 0, and so on. While one thousand tests and one million (1M) coverage points are illustrated in coverage matrix 210, it should be recognized that coverage matrix 210 may include any number of tests and any number of coverage points based on which an optimized (or reduced) set of test cases is to be generated.

Test case list 220 represents the optimized (or reduced) test case list that is to be generated based on the weights assigned to each test case in a machine learning model, as discussed above. Generally, the test list may include, for each test case, a seed count associated with a weight assigned to each test. In this example, a test may have a seed count of 1, indicating that the test will be included in the optimized (or reduced) test case list for use in testing the integrated circuit design (e.g., in an EDA tool), or a seed count of 0, indicating that the test will not be included in the optimized (or reduced) test case list and will thus not be executed on the integrated circuit design (e.g., because the test would test coverage points already covered by executing other tests).

Expected coverage matrix 230 illustrates the number of times that each coverage point (or coverage bin) will be hit (or tested) when the test cases in test case list 220 having a seed count of 1 are executed on the integrated circuit design. In order to ensure that all coverage points are hit during testing, the expected coverage for each coverage point in expected coverage matrix 230 should be at least one. Ideally, an optimized (or reduced) test case list, as discussed, may be configured such that each coverage point is hit once while minimizing an amount of redundancy.

To generate test case list 220, a machine learning model may be trained as a regression model that takes probability vectors for each test (from coverage matrix 210) as an input and generates the expected coverage matrix 230 as output. The machine learning model may be trained by backpropagating a coverage gap (e.g., represented as a hinge loss) through the machine learning model. In some aspects, the coverage gap may be augmented with a regularizer term that accounts for the computational expense (e.g., processing time) incurred by executing each test case of the plurality of test cases 110. The regularizer term may be omitted or calculated using a same cost value (e.g., a cost value of 1) for each test if the machine learning model is trained to minimize the number of test cases executed on the integrated circuit without considering the computational expense of the test cases and may be included using test-case-specific cost values if the machine learning model is trained to generate the optimized (or reduced) test case list by balancing the number of tests and the overall computational expense of testing the integrated circuit.

In some aspects, the generated test case list 220 may maximize the number of coverage points hit during execution of the test cases in the generated test case list 220. In some aspects, some coverage points, such as coverage points associated with corner cases representing rarely encountered operational environments or inputs, may not be tested. To minimize the number of coverage points that are not tested, the machine learning model may be pruned to remove coverage points that are covered by at least one test case in the generated test case list 220 and retrained based only on the coverage points that are not tested by the generated test case list 220.

Figure 3:
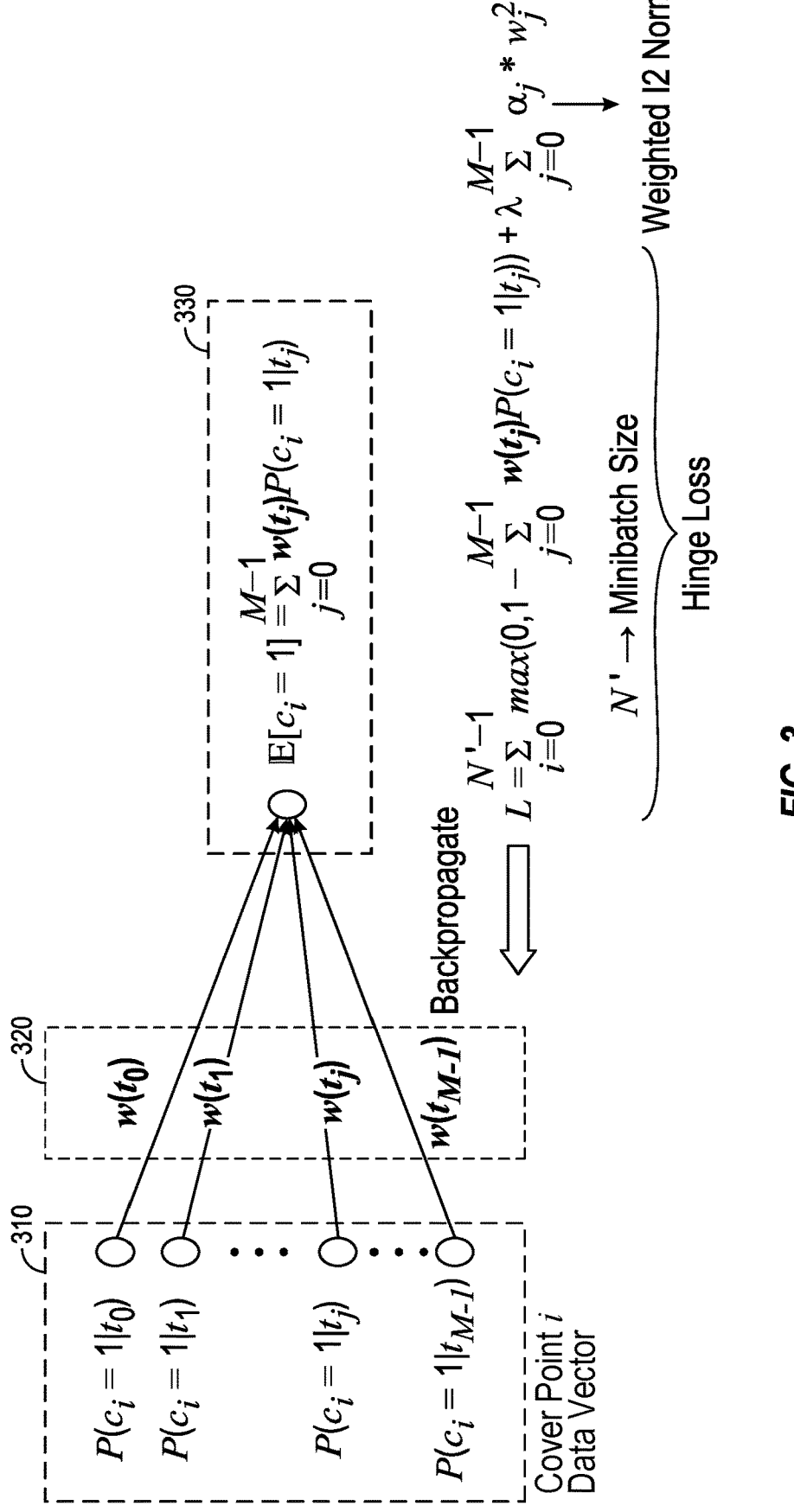
FIG. 3 illustrates an example neural network trained to identify a set of test cases for execution on an integrated circuit based on a coverage matrix.

FIG. 3 illustrates an example neural network 300 trained to identify a set of test cases for execution on an integrated circuit based on a coverage matrix.

As illustrated, neural network 300 may be a one-layer neural network with inputs 310 corresponding to each test of the plurality of test cases being reduced to an expected coverage matrix 330 illustrating the expected coverage for each coverage point given a set of weights 320 assigned to the test cases. As discussed, neural network 300 may be a regression model that generates weights 320 based on backpropagating a hinge loss and, in some aspects, a weighted norm, through the neural network.

Inputs 310 to the neural network 300 generally include a node associated with each test case of the plurality of test cases for which an optimized (or reduced) test case (also referred to hereinafter as a "selected test case list") list is to be generated. Each input node in inputs 310 receives, as input, a probability vector including the probability that the test case hits each coverage point c. That is, a probability vector for the $j^{th}$ test case includes probability values for each coverage point $c_i$, $i \in \{0, 1, \ldots, M-1\}$ illustrating the probability that the test case hits the $i^{th}$ coverage point to be tested for the integrated circuit.

Expected coverage 330, as discussed above, identifies the expected coverage provided of the $i^{th}$ coverage point given the selected test cases and the weights associated with these tests, as identified by weights 320 learned by training the neural network 300. Expected coverage 330 may be represented by the equation:

$$\mathbb{E}[c_i = 1] = \sum_{j=0}^{M-1} w(t_j)P(c_i = 1 \mid t_j)$$

In this equation, the expected likelihood that the $i^{th}$ coverage point is hit during testing may be the sum of the weighted probabilities of hitting the test case for each of the j test cases included in inputs 310 to neural network 300. The weight, $w(t_j)$, corresponds to the learnable weight for the $j^{th}$ test case in weights 320. Generally, larger weight values for a given test case j correspond to a higher likelihood that the test case will be selected for inclusion in the selected test case list (e.g., because the test case hits a large number of coverage points at a low computational expense), while smaller weight values correspond to a lower likelihood that the test case will be selected for inclusion in the selected test case list (e.g., because the test case hits a small number of coverage points at a high computational expense). An expected coverage matrix may be generated based on the expected coverage 330 calculated for each coverage point given the test cases identified based on the weights 320 associated with the test cases in the selected set of test cases.

As discussed, to train the machine learning model and learn weights 320 based on which the selected test case list can be selected, a loss may be backpropagated for minimization, or at least reduction. The loss may be a hinge loss, augmented in some aspects by a weighted norm value. As discussed above, the hinge loss may be represented by the expression:

$$\frac{1}{N'} \sum_{i=0}^{N'-1} \max\left(0, 1 - \sum_{j=0}^{M-1} w(t_j)P(c_i = 1 \mid t_j)\right)$$

where N' represents a minibatch size, j represents an index of a test case in a universe of M test cases defined for the integrated circuit design, w(t) represents a weight assigned to the $j^{th}$ test case, and $P(c_i{=}1|t_j)$ represents the probability that the $j^{th}$ test case tests the $i^{th}$ coverage point $c_i$. The weighted norm value, which may be added to the hinge loss equation discussed above, may be represented by the expression:

$$\lambda \sum_{j=0}^{M-1} \alpha_j * w_j^2$$

where λ represents a regularization parameter which denotes a degree by which weights are modified within a layer of the machine learning model and $a_j$ represents the cost (e.g., computational expense, such as the runtime of a test) associated with the $j^{th}$ test case. The loss function may thus be represented by the equation:

$$L = \frac{1}{N'} \sum_{i=0}^{N'-1} \max\left(0, 1 - \sum_{j=0}^{M-1} w(t_j)P(c_i = 1 \mid t_j)\right) + \lambda \sum_{j=0}^{M-1} \alpha_j * w_j^2$$

FIG. 4 illustrates example operations 400 that may be performed by an integrated circuit testing system (e.g., a system implementing pipeline 100 illustrated in FIG. 1) to select a set of test cases and test an integrated circuit design based on the selected set of test cases, according to aspects described herein.

As illustrated, operations 400 begin at block 410, with generating a coverage matrix associated with a plurality of test cases for an integrated circuit and coverage points in a universe of coverage points (defined for a design of an integrated circuit) associated with each test case of the plurality of test cases. As discussed, the coverage matrix may be a two-dimensional matrix with coverage points on a first axis of the coverage matrix and test cases on a second axis of the coverage matrix.

In some aspects, each coverage point in the coverage matrix may be associated with a probability of hitting the coverage point for each test case of the plurality of test cases. Generally, a test case, when executed, either hits (tests) the coverage point or does not hit the coverage point; thus, a binomial distribution can be generated over historical test case execution data for each coverage point. The probability that a test case hits a coverage point may thus be represented as a ratio of the number of times the coverage point was hit during execution of a test case to the total number of times the test case was executed in historical data based on which the coverage matrix is generated.

At block 420, operations 400 may optionally proceed with training a machine learning model based on the coverage matrix (e.g., in aspects in which the machine learning model is trained by the integrated circuit testing system). It should be understood that the machine learning model may, in some aspects, be trained on a different computing system from the integrated circuit testing system, and this different computing system can deploy the trained machine learning model to the integrated circuit testing system for use in identifying test cases to execute on the integrated circuit design. The machine learning model generally includes trained weights associated with each test case of the plurality of test cases.

In some aspects, the weights associated with each test case may be weights associated with a number of times the test case was executed and how the test case contributes to ensuring that at least one coverage point is hit during execution of the test case. The probability may be weighted by a computational expense (e.g., total runtime, serving as a proxy metric for the complexity of a test case) associated with each test case of the plurality of test cases.

In some aspects, the machine learning model may be implemented by a single-layer neural network in which a plurality of input nodes is reduced to a single output node. The input nodes may correspond to vectors representing the universe of coverage points defined for the design of the integrated circuit. As discussed, each vector may include, for the $j^{th}$ test, $j \in \{0, M-1\}$, probability values for each coverage point $i$, $i \in N$, where N represents the total number of coverage points in the universe of coverage points defined for the design of the integrated circuit.

In some aspects, the machine learning model may be a model having been trained based on backpropagation of a hinge loss value associated with a plurality of test cases and a distance value weighted based on a cost factor associated with each test case of the plurality of test cases. As discussed, the hinge loss value may be based on different batch sizes, representing a subset of the coverage points for the integrated circuit. A sum of weighted probabilities for each test case j may be calculated for each coverage point, and the sum of weighted probabilities for each coverage point may be aggregated into the hinge loss value. In some aspects, the cost factor associated with each test case of the plurality of test cases may be set to influence how test cases are selected for inclusion in a selected subset of test cases to execute on the integrated circuit. When the cost factor is set to 1 (or the distance value is omitted) for each test case, the number of test cases included in the selected subset of test cases may be minimized. Otherwise, the cost factor may be associated with a computational expense incurred in executing each test case of the plurality of test cases, and the test cases included in the selected subset of test cases may be influenced based on both the number of coverage points hit by each test case and the computational expense of each test case.

At block 430, operations 400 proceed with selecting a subset of the plurality of test cases for execution on the integrated circuit based on the trained weights associated with each test case of the plurality of test cases and a threshold weight value. In some aspects, in executing the selected subset of the plurality of test cases, each coverage point in the universe of coverage points defined for the design of the integrated circuit may be hit at least once. In some aspects, the selected subset of the plurality of test cases may maximize the number of coverage points in the universe of coverage points defined for the design of the integrated circuit that are hit during testing.

In some aspects, selecting the subset of the plurality of test cases may include selecting a minimal number of test cases that maximizes a number of coverage points in the universe of coverage points defined for the design of the integrated circuit being tested at least once. The minimal number of test cases may further be selected based on various cost thresholds or other computational constraints, such as on a computational cost threshold (which may be calculated on a per-test-case basis or an aggregated basis).

At block 440, operations 400 proceed with testing the integrated circuit based on the selected subset of test cases.

Figure 5:
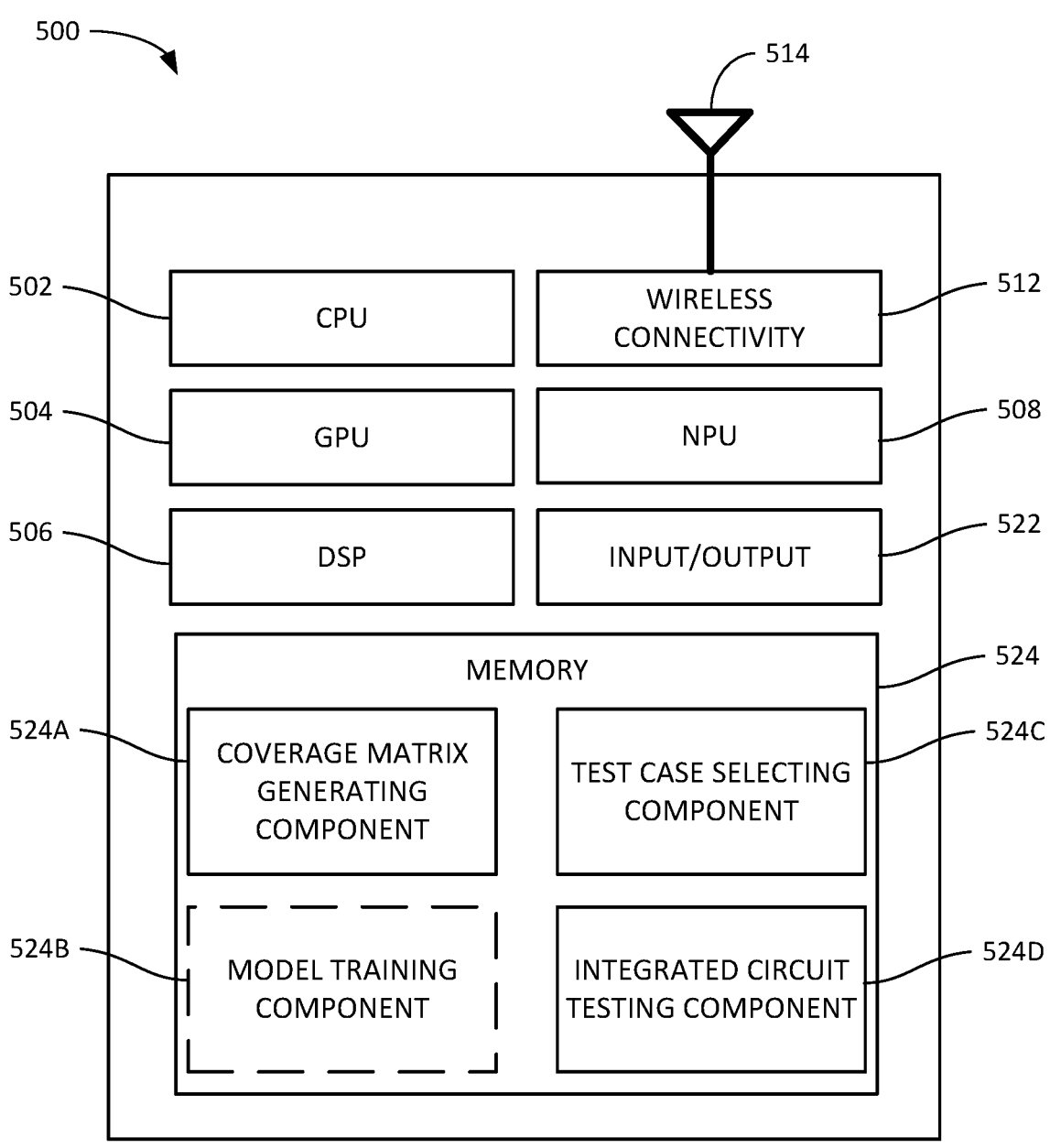
FIG. 5 illustrates an example implementation of a processing system in which an integrated circuit design can be tested based on a set of test cases identified for the integrated circuit design by a machine learning model, according to aspects of the present disclosure.

Example Processing System for
Machine-Learning-Based Integrated Circuit Design
Test Case Selection FIG. 5 depicts an example processing system 500 for selecting test cases for machine-learning-based integrated circuit design testing, such as described herein for example with respect to FIG. 4.

Processing system 500 includes a central processing unit (CPU) 502, which in some examples may be a multi-core CPU. Instructions executed at the CPU 502 may be loaded, for example, from a program memory associated with the CPU 502 or may be loaded from a memory 524.

Processing system 500 also includes additional processing components tailored to specific functions, such as a graphics processing unit (GPU) 504, a digital signal processor (DSP) 506, a neural processing unit (NPU) 508, and a wireless connectivity component 512.

An NPU, such as NPU 508, is generally a specialized circuit configured for implementing the control and arithmetic logic for executing machine learning algorithms, such as algorithms for processing artificial neural networks (ANNs), deep neural networks (DNNs), random forests (RFs), and the like. An NPU may sometimes alternatively be referred to as a neural signal processor (NSP), tensor processing unit (TPU), neural network processor (NNP), intelligence processing unit (IPU), vision processing unit (VPU), or graph processing unit.

NPUs, such as NPU 508, are configured to accelerate the performance of common machine learning tasks, such as image classification, machine translation, object detection, and various other predictive models. In some examples, a plurality of NPUs may be instantiated on a single chip, such as a system-on-a-chip (SoC), while in other examples the NPUs may be part of a dedicated neural-network accelerator.

NPUs may be optimized for training or inference, or in some cases configured to balance performance between both. For NPUs that are capable of performing both training and inference, the two tasks may still generally be performed independently.

NPUs designed to accelerate training are generally configured to accelerate the optimization of new models, which is a highly compute-intensive operation that involves inputting an existing dataset (often labeled or tagged), iterating over the dataset, and then adjusting model parameters, such as weights and biases, in order to improve model performance. Optimizing based on a wrong prediction may involve propagating back through the layers of the model and determining gradients to reduce the prediction error.

NPUs designed to accelerate inference are generally configured to operate on complete models. Such NPUs may thus be configured to input a new piece of data and rapidly process this piece through an already trained model to generate a model output (e.g., an inference).

In some implementations, NPU 508 is a part of one or more of CPU 502, GPU 504, and/or DSP 506.

Processing system 500 may also include one or more input and/or output devices 522, such as screens, touch-sensitive surfaces (including touch-sensitive displays), physical buttons, speakers, microphones, and the like.

In some examples, one or more of the processors of processing system 500 may be based on an ARM or RISC-V instruction set.

Processing system 500 also includes memory 524, which is representative of one or more static and/or dynamic memories, such as a dynamic random access memory, a flash-based static memory, and the like. In this example, memory 524 includes computer-executable components, which may be executed by one or more of the aforementioned processors of processing system 500.

In particular, in this example, memory 524 includes coverage matrix generating component 524A, model training component 524B, test case selecting component 524C, and integrated circuit testing component 524D. The depicted components, and others not depicted, may be configured to perform various aspects of the methods described herein.

Example Clauses

Implementation details of various aspects of the present disclosure are described in the following numbered clauses:

Clause 1: A processor-implemented method, comprising: generating a coverage matrix associated with a plurality of test cases for an integrated circuit and coverage points in a universe of coverage points associated with each test case of the plurality of test cases; selecting a subset of the plurality of test cases for execution on the integrated circuit based on weights associated with each test case of the plurality of test cases and a threshold weight value, wherein the weights associated with each test case of the plurality of test cases comprise weights in a machine learning model trained based on the coverage matrix; and testing the integrated circuit based on the selected subset of test cases.

Clause 2: The method of Clause 1, wherein the weights associated with each test case of the plurality of test cases comprise weights associated with a number of times the test case was executed and how the test case contributes to ensuring that at least one coverage point is hit during execution of the test case.

Clause 3: The method of Clause 1 or 2, wherein each coverage point is associated with a probability of hitting the coverage point for each test case of the plurality of test cases, the probability being calculated based on a binomial distribution over historical test case execution data for each coverage point in the universe of coverage points.

Clause 4: The method of any of Clauses 1 through 3, wherein the machine learning model is implemented by a single-layer neural network.

Clause 5: The method of Clause 4, wherein the single-layer neural network reduces an input data set of nodes associated with vectors representing the universe of coverage points to a single output node for the single-layer neural network.

Clause 6: The method of any of Clauses 1 through 5, wherein the machine learning model comprises a model having been trained based on backpropagation of a hinge loss value associated with the plurality of test cases and a distance value weighted based on a cost factor associated with each test case of the plurality of test cases.

Clause 7: The method of Clause 6, wherein the cost factor is set to 1 in order to minimize a number of test cases included in the selected subset of test cases.

Clause 8: The method of Clause 6, wherein the cost factor associated with the plurality of test cases is associated with a computational expense incurred in executing each test case of the plurality of test cases.

Clause 9: The method of any of Clauses 1 through 8, wherein selecting the subset of the plurality of test cases for execution comprises selecting a minimal number of test cases that maximizes a number of coverage points in the universe of coverage points being tested at least once.

Clause 10: The method of Clause 9, wherein the minimal number of test cases that maximizes the number of coverage points being tested at least once is selected based on a computational cost threshold.

Clause 11: An apparatus comprising: a memory having executable instructions stored thereon; and a processor configured to execute the executable instructions to cause the apparatus to perform a method in accordance with of any of Clauses 1 through 10.

Clause 12: An apparatus comprising means for performing a method in accordance with of any of Clauses 1 through 10.

Clause 13: A non-transitory computer-readable medium having instructions stored thereon which, when executed by a processor, perform a method in accordance with of any of Clauses 1 through 10.

Clause 14: A computer program product embodied on a computer-readable storage medium comprising code for performing a method in accordance with of any of Clauses 1 through 10.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A processor-implemented method, comprising:
generating a coverage matrix associated with a plurality of test cases for an integrated circuit and coverage points in a universe of coverage points associated with each test case of the plurality of test cases;
selecting a subset of the plurality of test cases for execution on the integrated circuit based on weights associated with each test case of the plurality of test cases and a threshold weight value, wherein the weights associated with each test case of the plurality of test cases comprise weights in a machine learning model trained based on the coverage matrix; and
testing the integrated circuit based on the selected subset of test cases;
wherein selecting the subset of the plurality of test cases for execution comprises selecting a minimal number of test cases that maximizes a number of coverage points in the universe of coverage points being tested at least once.

2. The method of claim 1, wherein the weights associated with each test case of the plurality of test cases comprise weights associated with a number of times the test case was executed and how the test case contributes to ensuring that at least one coverage point is hit during execution of the test case.

3. The method of claim 1, wherein each coverage point is associated with a probability of hitting the coverage point for each test case of the plurality of test cases, the probability being calculated based on a binomial distribution over historical test case execution data for each coverage point in the universe of coverage points.

4. The method of claim 1, wherein the machine learning model is implemented by a single-layer neural network.

5. The method of claim 4, wherein the single-layer neural network reduces a plurality of input nodes associated with vectors representing the universe of coverage points to a single output node for the single-layer neural network.

6. The method of claim 1, wherein the machine learning model comprises a model having been trained based on backpropagation of a hinge loss value associated with the plurality of test cases and a distance value weighted based on a cost factor associated with each test case of the plurality of test cases.

7. The method of claim 6, wherein the cost factor is set to 1 in order to minimize a number of test cases included in the selected subset of test cases.

8. The method of claim 6, wherein the cost factor associated with each test case of the plurality of test cases is associated with a computational expense incurred in executing each test case of the plurality of test cases.

9. The method of claim 1, wherein the minimal number of test cases that maximizes the number of coverage points being tested at least once is selected based on a computational cost threshold.

10. A system, comprising:
a memory having executable instructions stored thereon; and
a processor configured to execute the executable instructions in order to cause the system to:
generate a coverage matrix associated with a plurality of test cases for an integrated circuit and coverage points in a universe of coverage points associated with each test case of the plurality of test cases;
select a subset of the plurality of test cases for execution on the integrated circuit based on weights associated with each test case of the plurality of test cases and a threshold weight value, wherein the weights associated with each test case of the plurality of test cases comprise weights in a machine learning model trained based on the coverage matrix; and
test the integrated circuit based on the selected subset of test cases;
wherein in order to select the subset of the plurality of test cases for execution, the processor is configured to cause the system to select a minimal number of test cases that maximizes a number of coverage points in the universe of coverage points being tested at least once.

11. The system of claim 10, wherein the weights associated with each test case of the plurality of test cases comprise weights associated with a number of times the test case was executed and how the test case contributes to ensuring that at least one coverage point is hit during execution of the test case.

12. The system of claim 10, wherein each coverage point is associated with a probability of hitting the coverage point for each test case of the plurality of test cases, the probability being calculated based on a binomial distribution over historical test case execution data for each coverage point in the universe of coverage points.

13. The system of claim 10, wherein the machine learning model is implemented by a single-layer neural network.

14. The system of claim 13, wherein the single-layer neural network reduces an input data set of nodes associated with vectors representing the universe of coverage points to a single output node for the single-layer neural network.

15. The system of claim 10, wherein the machine learning model comprises a model having been trained based on backpropagation of a hinge loss value associated with the plurality of test cases and a distance value weighted based on a cost factor associated with each test case of the plurality of test cases.

16. The system of claim 15, wherein the cost factor is set to 1 in order to minimize a number of test cases included in the selected subset of test cases.

17. The system of claim 15, wherein the cost factor associated with each test case of the plurality of test cases is associated with a computational expense incurred in executing each test case of the plurality of test cases.

18. The system of claim 11, wherein the minimal number of test cases that maximizes the number of coverage points being tested at least once is selected based on a computational cost threshold.

19. A system, comprising:
  means for generating a coverage matrix associated with a plurality of test cases for an integrated circuit and coverage points in a universe of coverage points associated with each test case of the plurality of test cases;
  means for selecting a subset of the plurality of test cases for execution on the integrated circuit based on weights associated with each test case of the plurality of test cases and a threshold weight value, wherein the weights associated with each test case of the plurality of test cases comprise weights in a machine learning model trained based on the coverage matrix; and
  means for testing the integrated circuit based on the selected subset of test cases;
  wherein the means for selecting the subset of the plurality of test cases for execution comprises selecting a minimal number of test cases that maximizes a number of coverage points in the universe of coverage points being tested at least once.

20. The system of claim 19, wherein the weights associated with each test case of the plurality of test cases comprise weights associated with a number of times the test case was executed and how the test case contributes to ensuring that at least one coverage point is hit during execution of the test case.

21. The system of claim 19, wherein each coverage point is associated with a probability of hitting the coverage point for each test case of the plurality of test cases, the probability being calculated based on a binomial distribution over historical test case execution data for each coverage point in the universe of coverage points.

22. The system of claim 19, wherein the machine learning model is implemented by a single-layer neural network.

23. The system of claim 22, wherein the single-layer neural network reduces an input data set of nodes associated with vectors representing the universe of coverage points to a single output node for the single-layer neural network.

24. The system of claim 19, wherein the machine learning model comprises a model having been trained based on backpropagation of a hinge loss value associated with the plurality of test cases and a distance value weighted based on a cost factor associated with each test case of the plurality of test cases.

25. The system of claim 24, wherein the cost factor is set to 1 in order to minimize a number of test cases included in the selected subset of test cases.

26. The system of claim 24, wherein the cost factor associated with each test case of the plurality of test cases is associated with a computational expense incurred in executing each test case of the plurality of test cases.

27. A computer-readable medium having instructions stored thereon which, when executed by at least one processor, cause the at least one processor to perform an operation comprising:
  generating a coverage matrix associated with a plurality of test cases for an integrated circuit and coverage points in a universe of coverage points associated with each test case of the plurality of test cases;
  selecting a subset of the plurality of test cases for execution on the integrated circuit based on weights associated with each test case of the plurality of test cases and a threshold weight value, wherein the weights associated with each test case of the plurality of test cases comprise weights in a machine learning model trained based on the coverage matrix; and
  testing the integrated circuit based on the selected subset of test cases;
  wherein selecting the subset of the plurality of test cases for execution comprises selecting a minimal number of test cases that maximizes a number of coverage points in the universe of coverage points being tested at least once.

* * * * *